United States Patent
Kobayashi (10) Patent No.: US 6,509,271 B1
(45) Date of Patent: Jan. 21, 2003

(54) MANUFACTURING METHOD OF SEMICONDUCTOR DEVICE

(75) Inventor: Migaku Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/621,566

(22) Filed: Jul. 21, 2000

(30) Foreign Application Priority Data

Jul. 27, 1999 (JP) .......................................... 11-212342

(51) Int. Cl.⁷ .............................................. H01L 21/00
(52) U.S. Cl. ........................... 438/692; 216/38; 216/67; 216/79; 438/719; 438/723; 438/724; 438/743; 438/744
(58) Field of Search ................................ 438/691, 692, 438/719, 723, 724, 743, 744, 745, 756; 216/38, 67, 79, 88, 89

(56) References Cited

U.S. PATENT DOCUMENTS 5,516,721 A * 5/1996 Galli et al. .............. 438/692 X
5,858,858 A * 1/1999 Park et al. .............. 438/692 X

* cited by examiner

*Primary Examiner*—William A. Powell
(74) *Attorney, Agent, or Firm*—Scully, Scott, Murphy & Presser

(57) ABSTRACT

The present invention provides a manufacturing method of a semiconductor device including the steps of: forming a silicon nitride film on a semiconductor substrate and forming a CVD silicon oxide film on the silicon nitride film, patterning the silicon nitride film and the CVD silicon oxide film using a resist mask, forming a trench by etching the semiconductor substrate by using the patterned silicon nitride film and the patterned CVD silicon oxide film as a mask after releasing the resist mask, and embedding an insulating material into the trench and flattening the embedded insulating material using the silicon nitride film as a stopper, in which the manufacturing method includes a step of annealing the semiconductor substrate after the step of forming the CVD silicon oxide film and before the step of etching the semiconductor substrate.

8 Claims, 7 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device, and more specifically a method for forming a trench element isolator region.

2. Description of the Prior Art

For finer configuration and enhancement of a manufacturing speed of a semiconductor element, it is necessary to narrow width of an element isolator. Though an LOCOS method has conventionally been used in general as a method to form the element isolator region, this method cannot sufficiently cope with a demand for such configuration. As a method substituting for the LOCOS method, an STI (Shallow Trench Isolation) method has recently been attracting attention.

The conventional STI method forms the element isolator by laminating a thin pad oxide film and a nitride film on a semiconductor substrate such as a silicon substrate, forming a resist mask having a region open for isolating the element by a photolithography method, forming a trench by anisotropically etching the nitride film, the pad oxide film and the semiconductor substrate using the resist mask as an etching mask, depositing an insulating material over an entire surface after removing the resist mask, polishing the semiconductor substrate by a Chemical Mechanical Polishing (CMP) method using the nitride film as a stopper and embedding an insulating material into the trench.

In the case where a pattern of the resist mask cannot be formed in a desired shape, this method may require releasing the resist mask and forming a resist mask once again (reconstruction). However, this method poses a problem that an acid solution which is used as a resist mask releasing solution roughens a surface of the nitride film, thereby changing an optical characteristic on the surface of the nitride film and degrading an efficiency of the reconstruction. That is, the method allows thickness of the nitride film to be varied and may make it impossible to form the pattern in the desired shape under influence due to a standing wave, thereby varying film thickness for each reconstruction and making it extremely difficult to form the pattern in the desired shape.

In order to solve such a problem in the reconstruction, it has conventionally been proposed to deposit a silicon oxide film on the nitride film. Description will be made of this conventional technique with reference to FIGS. 5(A) through 5(D) and FIGS. 6(A) through 6(C).

Figure 5:
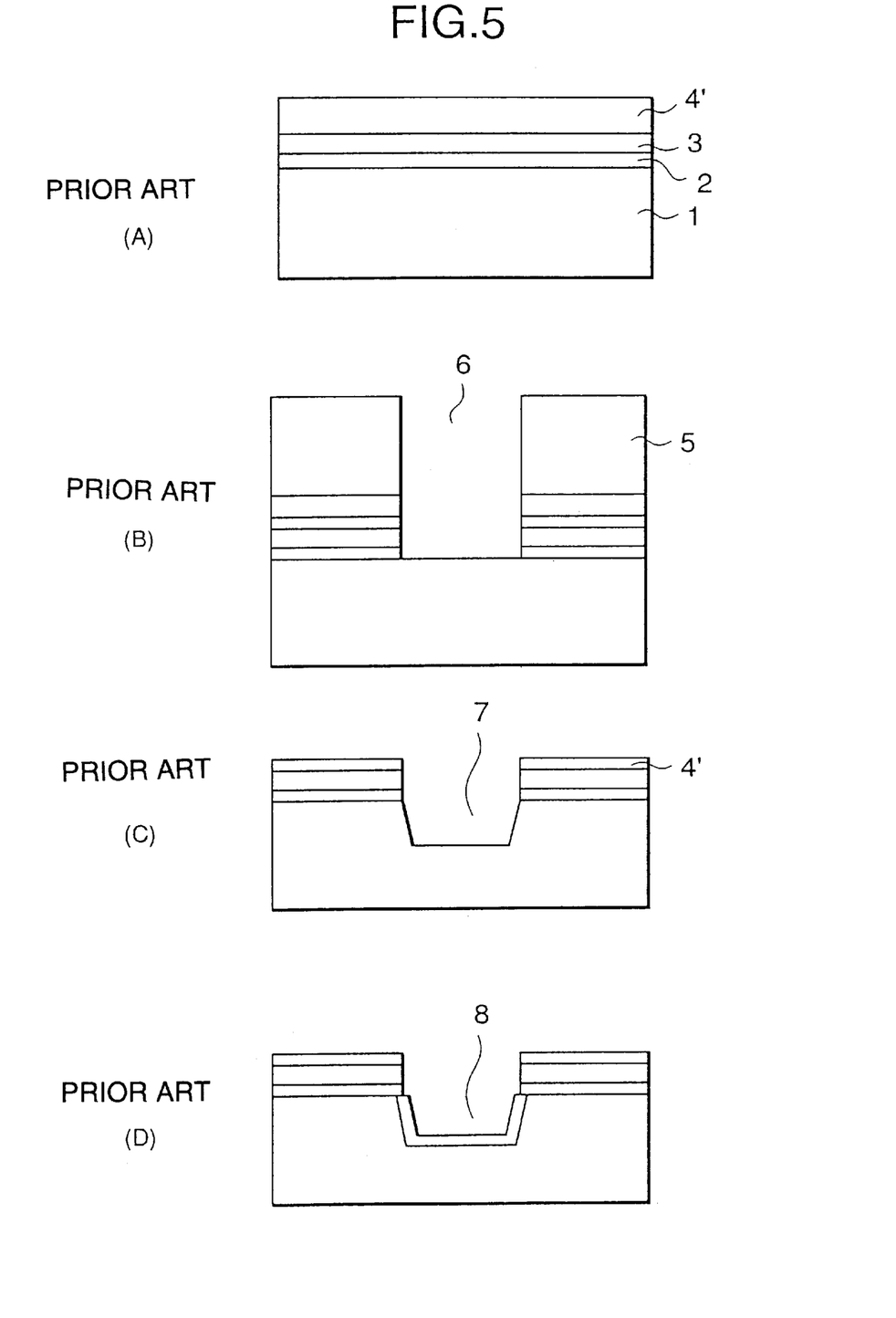
FIGS. 5(A) through 5(D) are sectional views illustrating steps of manufacturing a semiconductor device according to the prior art.

FIGS. 5(A) through 5(D) are sectional views illustrating steps of forming a trench element isolator by a conventional method. First, a thin pad oxide film 2 is formed on a semiconductor substrate such as an Si substrate 1 as shown in FIG. 5(A) by a thermal oxidation method or the like and a silicone nitride film 3 having desired thickness is successively formed by an LPCVD method or the like. Furthermore, a silicon oxide film 4' having thickness on the order of 1000 to 2000 Å is formed on the silicon nitride film 3 by the LPCVD method or the like.

Successively, a resist mask 5 is formed by applying a resist and carrying out an ordinary photolitho process so as to open a portion which is to form an element isolator, and an opening 6 is formed as shown in FIG. 5(B) by consecutively dry etching the oxide film 4', the nitride film 3 and the pad oxide film 2 using the resist mask 5 as an etching mask until a surface of the Si substrate 1 is exposed. Successively, the resist mask 5 is released and a trench 7 on the order of 2000 to 4000 Å is formed by anisotropically etching, dry etching in particular, the exposed surface of the Si substrate 1 using the oxide film 4' as an etching mask (FIG. 5(C)).

The oxide film 4' must be formed thick as described above since the oxide film 4' is also etched and thinned when the Si substrate 1 is etched.

The resist mask 5 is released before etching the Si substrate since etching residues have been accumulated on the resist mask.

That is, the etching residues (hereinafter referred to as "etching residues deriving from insulating materials") have been produced due to a reaction between an oxide film etching gas and the oxide film, a reaction between a nitride film etching gas and the nitride film and reactions between these etching gases and a resist material while etching the oxide film 4', the nitride film 3 and the pad oxide film 2. Furthermore, etching residues such as a product formed by a reaction between Si and an etching gas (hereinafter referred to as "residues deriving from Si") are formed when the Si substrate is etched using the resist mask 5 as the etching mask.

These etching residues should be removed before an oxide film is subsequently embedded into the trench. The residues deriving from the insulating materials can be removed by a treatment with an acid solution, for example, a resist releasing solution, a treatment with $O_2$ plasma, whereas the etching residues deriving from Si can hardly be removed.

On the other hand, treatment only with the acid solution makes it difficult to remove the residues deriving from the insulating materials and all the etching residues cannot be removed at the same time. Accordingly, the method according to the present invention is configured by releasing the resist mask 5 before etching the Si substrate for removing the residues deriving from the insulating materials, then etch the Si substrate using the oxide film 4' as the etching mask and thereafter remove the etching residues deriving from Si.

After these steps, an oxide film is embedded into the trench 7 which has been formed. Since the silicon substrate has been damaged by the anisotropic etching which has been carried out to form the trench, a thermally oxidized film 8 is formed in this step to correct the damage. (FIG. 5(D)).

Figure 6:
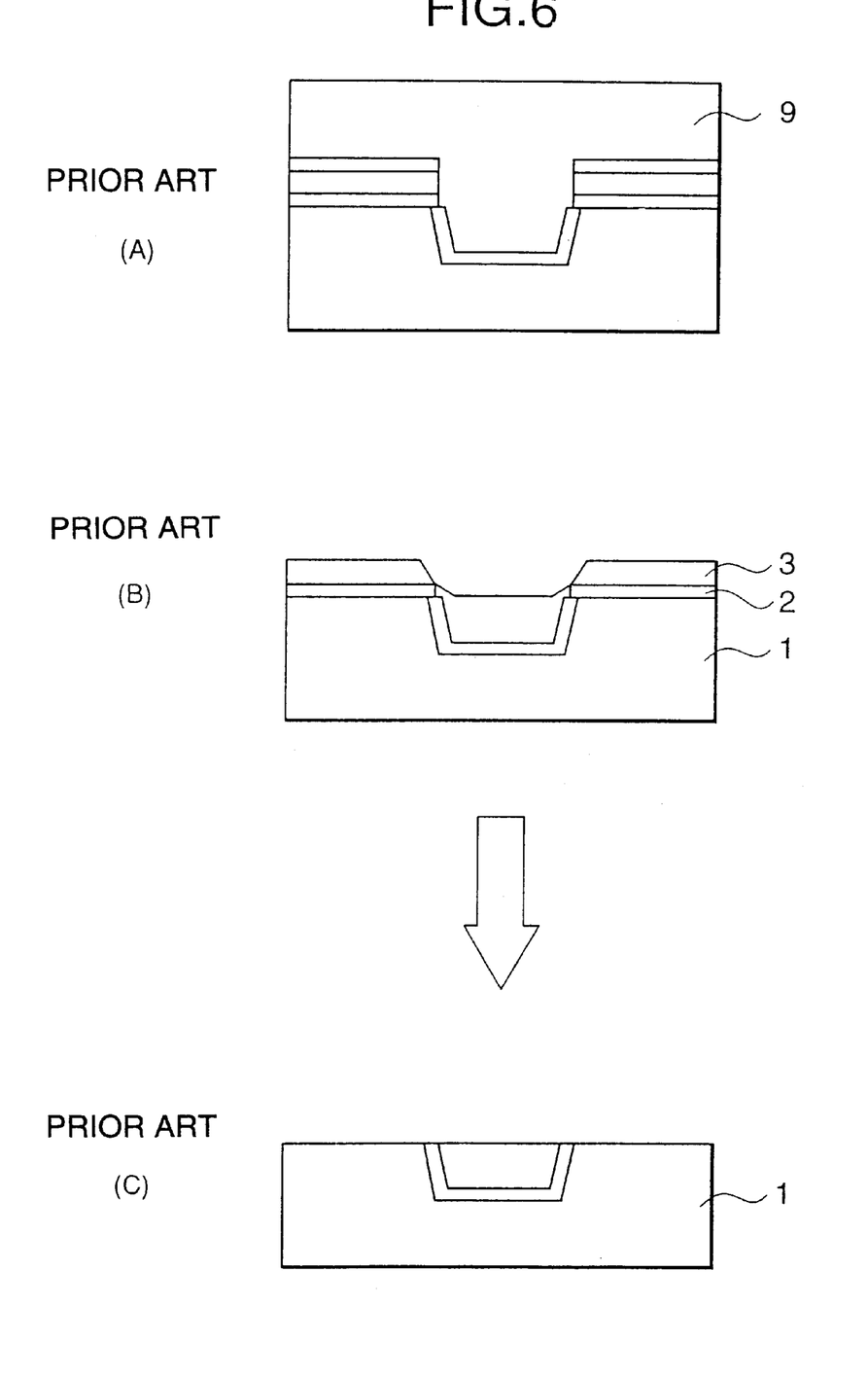
FIGS. 6(A) through 6(C) are sectional views illustrating steps of manufacturing the semiconductor device according to the prior art.

Successively, a thick CVD oxide film 9 is deposited over an entire surface by a CVD method such as an HDPCVD (High Density Plasma Chemical Vapor Deposition) method (FIG. 6(A)) and the CVD oxide film 9 is polished by the Chemical Mechanical Polishing (CMP) method using the nitride film 3 as a stopper (FIG. 6(B)). Finally, the nitride film 3 is removed with heated phosphoric acid and the pad oxide film 2 is removed with hydrofluoric acid solution, thereby forming a trench element isolator as shown in FIG. 6(C).

Figure 7:
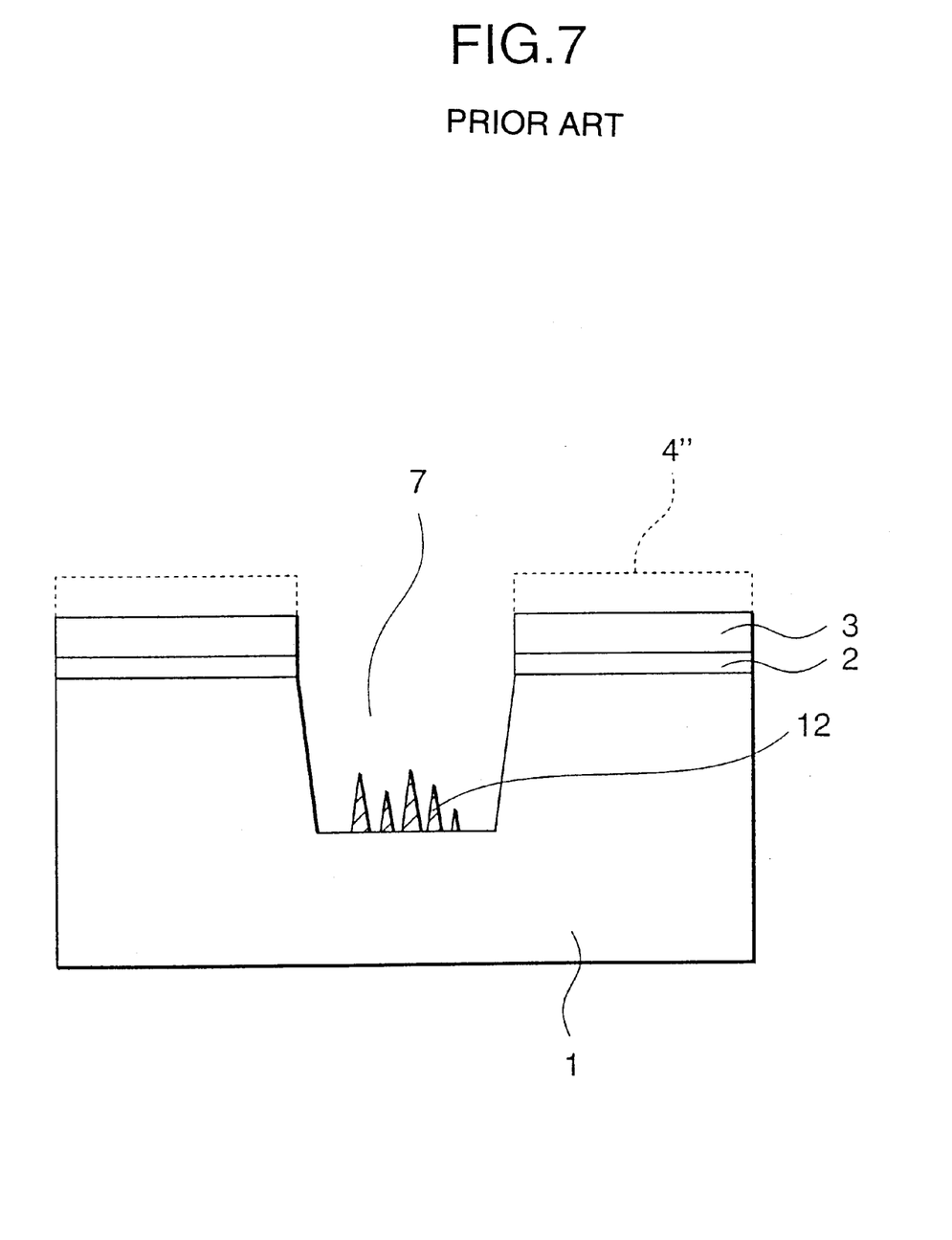
FIG. 7 is a conceptual diagram describing problem posed by the conventional art.

Since the oxide film 4' formed on the nitride film 3 is thinned by etching the Si substrate 1 as described above, the oxide film 4' must be formed thick. A reason is that the oxide film 4' which is formed thin is also etched and disappears (4"), thereby exposing the nitride film 3 as shown in FIG. 7 when the Si substrate is etched. If the trench is etched continuously in a condition where the nitride film 3 is exposed, a pole like residue 12 will be formed on a bottom of the trench by a product formed by a reaction between an etching gas and the nitride film. Since production of such a residue poses a problem of making it impossible to form the trench in the desired form, the oxide film 4' is formed thick enough to prevent such a residue from being produced.

When an opening is formed by etching the thick oxide film 4, however, there is posed a problem that a width variation of the opening is larger in proportion to film thickness. Under the present circumstances where semiconductor devices are configured finer and finer, there is a tendency to narrow variation ranges allowable for opening widths and such a thick oxide film is going not to cope with a narrow variation range of an opening width.

BRIEF SUMMARY OF THE INVENTION

Objects of the Invention

An object of the present invention is to meet the demand for a finer semiconductor device by thinning an oxide film which must be conventionally formed thick on a nitride film.

SUMMARY OF THE INVENTION

A manufacturing method of a semiconductor device according to the present invention comprises a step of annealing a CVD oxide film which is formed on a nitride film by a conventional method, thereby densifying the CVD oxide. As a result, the densified oxide film is etched hardly and thinned less at a step of etching a semiconductor substrate such as a silicon substrate. That is, the manufacturing method according to the present invention which densities the CVD oxide film eliminates a conventional necessity to form a thick oxide film on a nitride film and prevents an opening width from being varied.

That is, the manufacturing method of a semiconductor device according to the present invention is a manufacturing method comprising a step of forming a silicon nitride film on a semiconductor substrate and forming a CVD silicon oxide film on the silicon nitride film, a step of patterning the silicon nitride film and the CVD silicon oxide film with a resist mask, a step of forming a trench by etching the semiconductor substrate using the patterned silicon nitride film and the patterned CVD silicon oxide film as an etching mask after releasing the resist mask, and a step of embedding an insulating material into the trench and flattening the embedded insulating material using the silicon nitride film as a stopper, wherein the manufacturing method comprises a step of annealing the semiconductor substrate after the step of forming the CVD silicon oxide film and before the step of etching the semiconductor substrate.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

A first embodiment of the present invention will be described with reference to the accompanying drawings. FIGS. 1(A) through 1(D) and FIGS. 2(A) through 2(C) are sectional views illustrating steps of a manufacturing method of a semiconductor device preferred as a first embodiment of the present invention.

Figure 1:
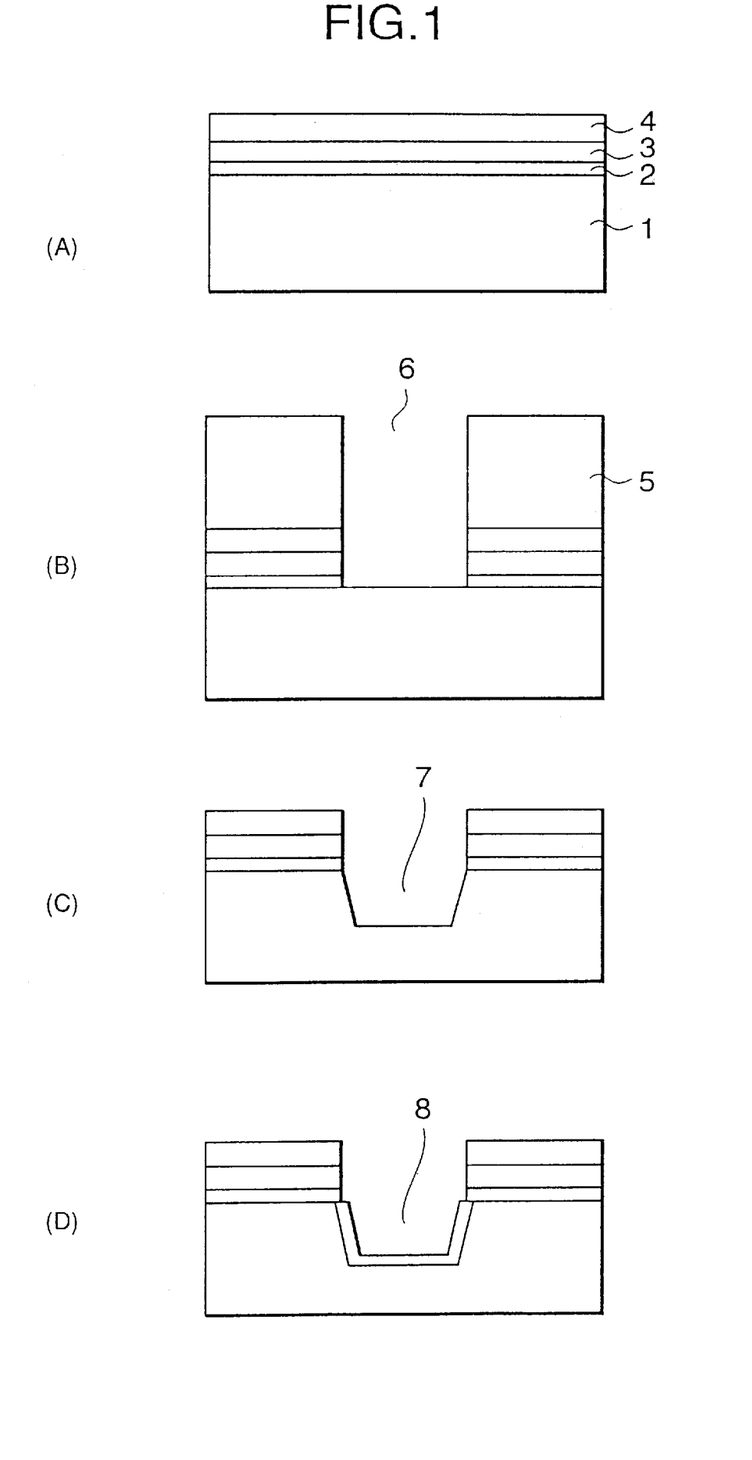
FIGS. 1(A) through 1(D) are sectional views illustrating steps of manufacturing a semiconductor device preferred as a first embodiment of the present invention.

First, a pad oxide film 2 having thickness on the order of 200 Å is formed by thermally oxidizing an Si substrate 1 at 900° C. in an $H_2$—$O_2$ atmosphere and a silicon nitride ($Si_3N_4$) film 3 having thickness on the order of 1500 Å is formed on the pad oxide film 2 by an LPCVD method using silane and ammonia as raw material gases within a temperature range on the order from 700 to 800° C. Furthermore, a CVD silicon oxide ($SiO_2$) film having thickness on the order of 500 Å is formed by the LPCVD method using TEOS as a raw material within a temperature range from 650 to 700° C.

The CVD silicon oxide film which is formed on a surface is densified by annealing, at 900° C. for 30 minutes in the $H_2$—$O_2$ atmosphere, the Si substrate 1 on which the pad oxide film 2, the silicon nitride film 3 and the CVD silicon oxide film have been formed (FIG. 1(A)).

This annealing treatment can be carried out not only before application of a resist as in the first embodiment but also after patterning insulating films on the semiconductor substrate.

The annealing treatment can be carried out in an inert gas atmosphere or an oxidizing atmosphere and provides a high effect when carried out in the oxidizing atmosphere or $H_2$—$O_2$ atmosphere in particular before application of a resist. After patterning the insulating films, on the other hand, the annealing treatment is carried out in the inert gas atmosphere to prevent an exposed surface of the semiconductor substrate from being oxidized.

The annealing treatment densifies the CVD silicon oxide film and enhances an etching selection ratio of the CVD silicon oxide film relative to the semiconductor substrate so that the CVD silicon oxide film is hardly etched at a step of etching the semiconductor substrate, thereby allowing the CVD silicon oxide film to be formed thinner than the conventional CVD oxide film.

That is, conventionally, in order to form a trench on the order of 2000 to 4000 Å, the conventional CVD oxide film must have thickness of 1000 to 2000 Å, whereas in the present invention the CVD silicon oxide film may have thickness below 1000 Å. Though a lower limit of film thickness cannot be unconditionally defined since the lower limit varies dependently on depth of a trench to be formed, it is desirable to define the lower limit at a level which is not smaller than 200 Å from viewpoints of film flatness and an etching selection ratio relative to the semiconductor substrate.

Selectable as an annealing temperature is a temperature which is used for forming the CVD silicon oxide film, for example, 650 to 700° C. which is used for forming the CVD silicon oxide film by the LPCVD method using the TEOS or a temperature on the order of 400° C. which is used for forming the CVD silicon oxide film by the CVD method using O3/TEOS, but the CVD silicon oxide film can be densified as far as an annealing temperature is higher than the temperature which is used for forming the CVD silicon oxide film. It is preferable to select an annealing temperature of 700° C. or higher. Though a higher annealing temperature provides a higher effect, an annealing temperature higher than a softening temperature of the silicon oxide film is to be avoided and it is desirable to select an annealing temperature up to 1200° C.

The oxide film which has been densified will be referred to as an oxide film 4 in description that follows.

Successively, a resist is applied to the oxide film 4, a predetermined pattern is formed by a photolitho process as a resist mask 5, and an opening 6 is formed by anisotropically dry etching the oxide film 4, the silicon nitride film 3 and the pad oxide film 2 using the resist mask 5 as an etching mask (FIG. 1(B)).

After ashing the semiconductor substrate with an $O_2$ plasma and removing etching residues from the resist mask 5 and an inside wall of the opening 6 using a resist releasing solution, a trench 7 is formed by dry etching the Si substrate 1 which is exposed in the opening 6 using the oxide film 4 as a mask (FIG. 1(C)). The trench is formed to a depth of 2500 Å in the first embodiment.

Successively, a thermally oxidized film 8 having thickness on the order of 400 Å is formed on an inside wall of the trench by thermally oxidizing the Si substrate 1 at 1100° C. in an $N_2$—$O_2$ atmosphere (FIG. 1(D)).

Figure 2:
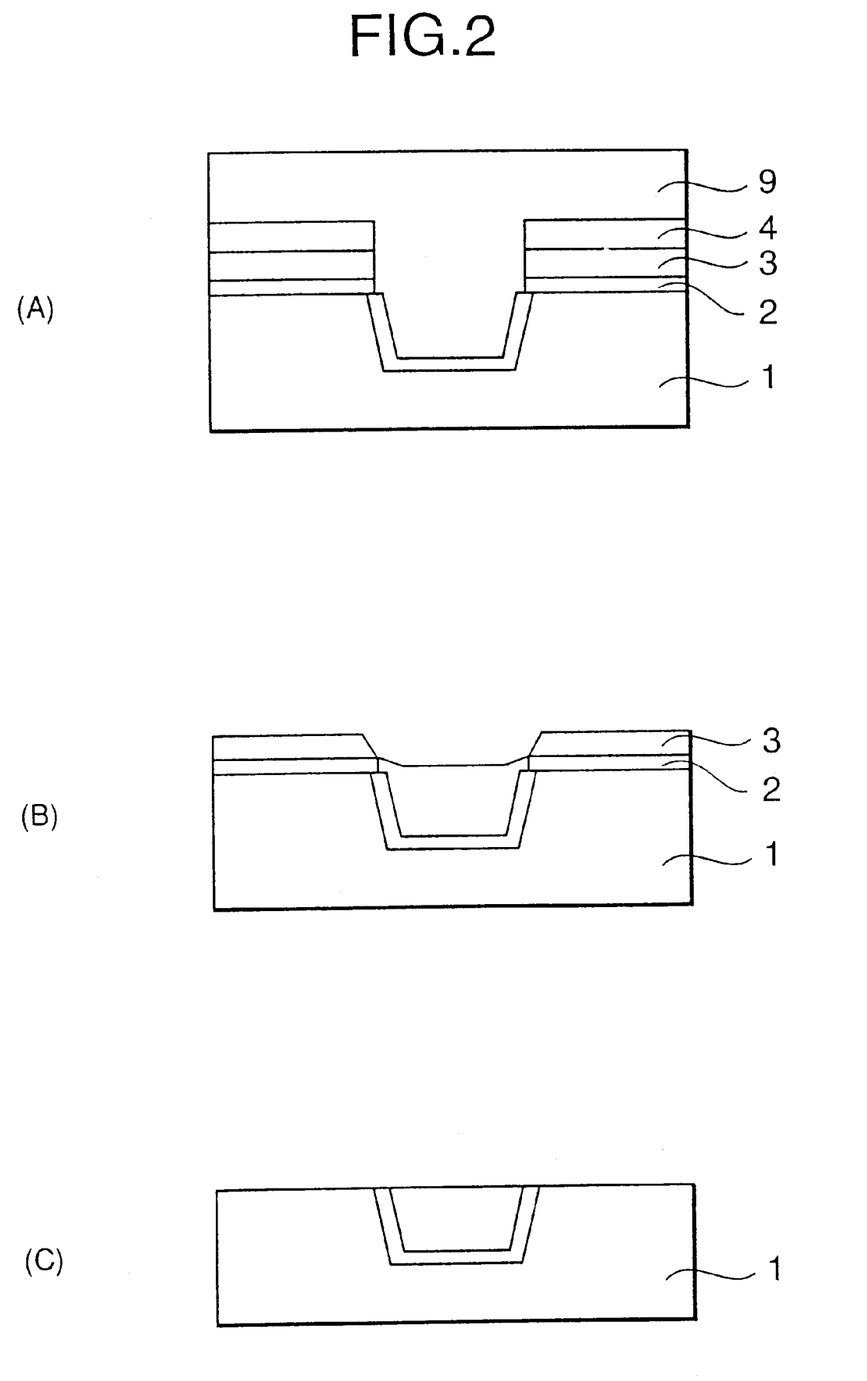
FIGS. 2(A) through 2(C) are sectional views illustrating steps of manufacturing the semiconductor device preferred as the first embodiment of the present invention.

In order to embed an oxide film into the trench thus formed, a CVD oxide film 9 having thickness on the order of 5500 Å is first formed over an entire surface by the HDPCVD method as shown in FIG. 2(A). Successively, a structure shown in FIG. 2(B) is obtained by polishing the CVD oxide film 9 and the oxide film 4 by the CMP method using the silicon nitride film 3 as a CMP stopper. Furthermore, a trench element isolator shown in FIG. 2(C) is formed by removing the silicon nitride film 3 with a heated phosphoric acid and removing the pad oxide film 2 with a hydrofluoric acid series solution. A conventionally known silicon oxide film or polysilicon is usable as the insulating material to be embedded in the trench formed in the bottom of the semiconductor substrate.

As an element is configured finer, it is necessary to form a trench narrower and expose it to rays having a short wavelength using an excimer laser such as KrF at a photolitho step of forming a trench pattern. Though reflection from a nitride film is not problematic at a conventional step of exposing a trench to an i-line which is scarcely reflected by the nitride film, rays reflected from the nitride film make it impossible to form a pattern as desired when a fine pattern is formed by exposing the trench to rays having such a short wavelength and it is proposed to use an SiON film or the like as an antireflection film.

By adding a step of interposing an SiON film between the silicon nitride film and the oxide film which is disposed on the surface, the manufacturing method according to the present invention is configured as a method which can also meet a demand for a further finer semiconductor device and such a manufacturing method will be described below as a second embodiment. Though the SiON film may have optional thickness so far as it can exhibit a function as an antireflection film, the film is to have thickness below an upper limit on the order of 1000 Å since too thick an SiON film complicates etching.

The second embodiment will be described taking as an example a case where a fine trench pattern is formed by the KrF excimer laser. FIGS. 3(A), 3(B), 3(C), 3(D), 4(A), 4(B) and 4(C) are sectional views illustrating steps of a manufacturing method of a semiconductor device preferred as the second embodiment.

First, a pad oxide film 2 and a silicon nitride film 3 are formed on a surface of an Si substrate 1 by thermal oxidation as in the first embodiment. On these oxide films, an SiON film 10 having thickness on the order of 350 Å is formed at 400° C. by the plasma CVD method using silane, nitrogen monoxide gas and nitrogen gas. On the SiON film, a CVD oxide film is further formed and densified by the annealing treatment as in the first embodiment, thereby forming an oxide film 4 (FIG. 3(A)).

Figure 3:
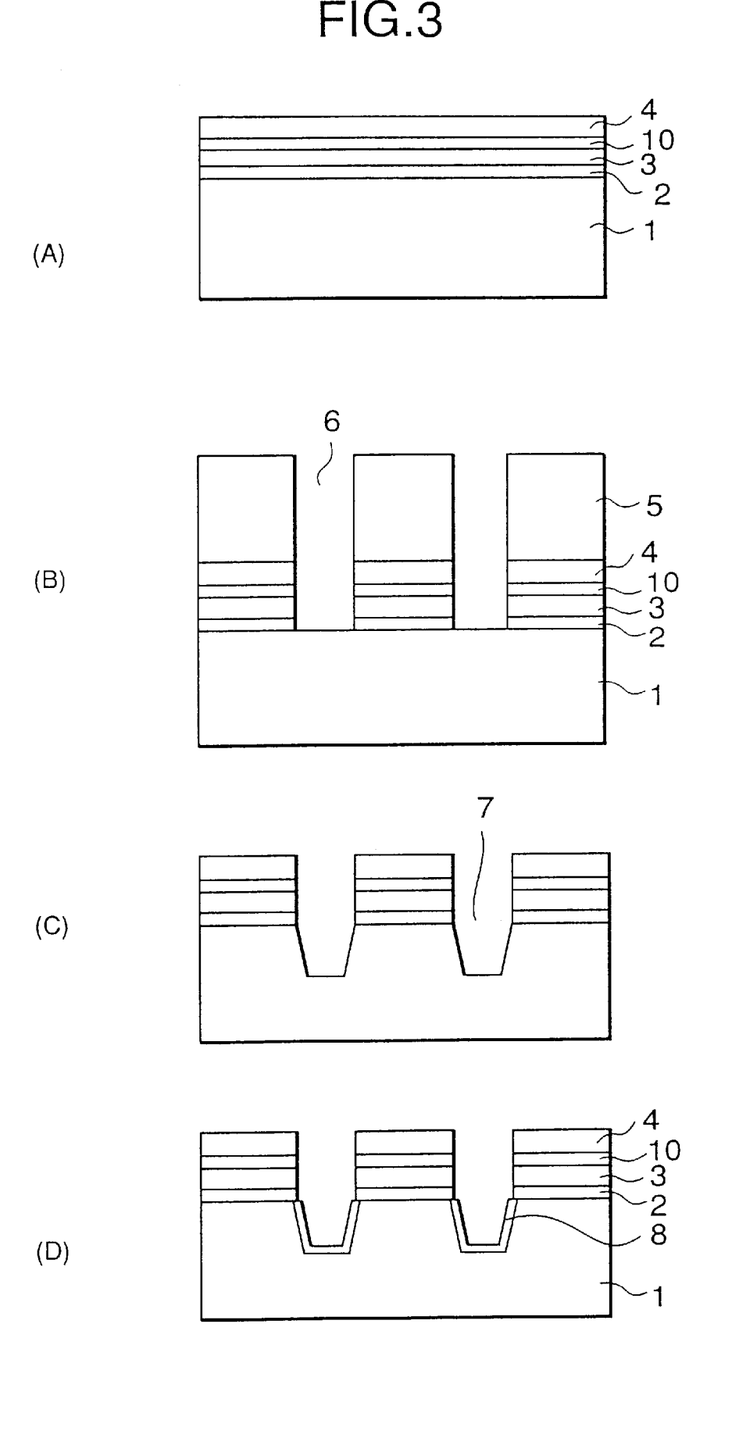
FIGS. 3(A) through 3(D) are sectional views illustrating steps of manufacturing a semiconductor device preferred as a second embodiment of the present invention.

Then, a chemical amplification type resists which has photosensitivity to the wavelength of the KrF excimer laser is applied to the oxide film 4, a resist mask 5 having a fine trench pattern is formed by the photolitho process using the KrF excimer laser, and an opening 6 is formed by consecutively dry etching the oxide film 4, the SiON film 10, the silicon nitride film 3 and the pad oxide film 2 using the resist mask 5 (FIG. 3(B)).

After ashing with the $O_2$ plasma and removing etching residues from the resist mask 5 and an inside wall of the opening 6 with a resist releasing solution, a trench 7 is formed by dry etching the Si substrate 1 exposed in the opening 6 by using the oxide film 4 as an etching mask (FIG. 3(C)). A trench 2500 Å deep is formed in the second embodiment.

Successively, a thermally oxidized film 8 having thickness on the order of 400 Å thick is formed on an inside wall of the trench by thermally oxidizing the trench at 1100°C. in an $N_2$—$O_2$ atmosphere (FIG. 3(D)).

Figure 4:
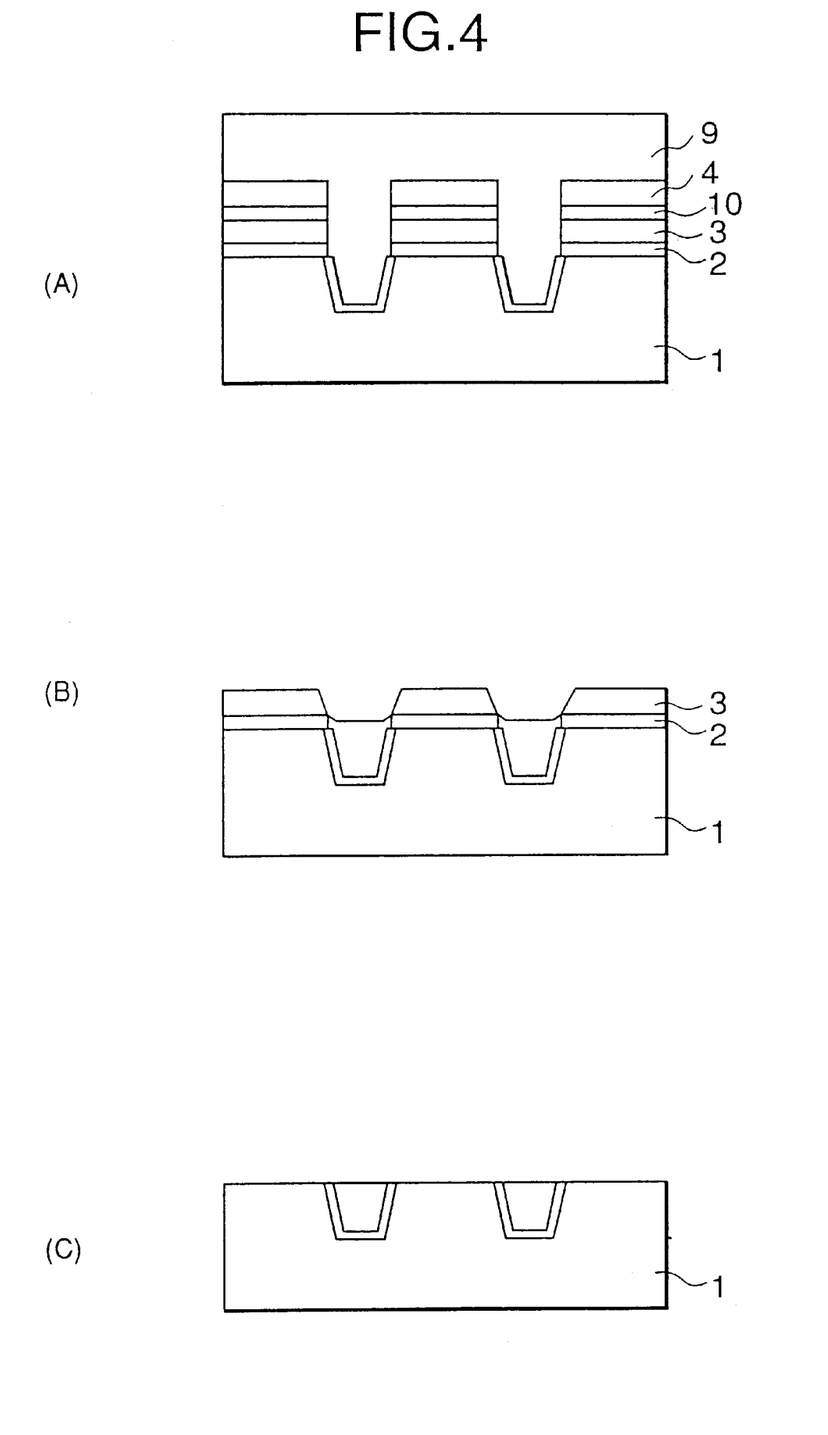
FIGS. 4(A) through 4(C) are sectional views illustrating steps of manufacturing the semiconductor device preferred as the second embodiment of the present invention.

In order to embed an oxide film into the trench thus formed, a CVD oxide film 9 having thickness on the order of 5500 Å is first formed over an entire surface as shown in FIG. 4(A) by the HDPCVD method. Successively, a structure shown in FIG. 4(B) was obtained by polishing the CVD oxide film 9 and the oxide film 4 by the CMP method using the silicon nitride film 3 as a CMP stopper. A trench element isolator shown in FIG. 4(C) is formed by removing the silicon nitride film 3 with heated phosphoric acid and removing the pad oxide film 2 with a hydrofluoric acid series solution.

As described above, the present invention makes it possible to thin a silicon oxide film formed on a silicon nitride film which is to be used as a hard mask for forming a trench, thereby preventing an opening width from being varied. As a result, the present invention makes it possible to meet the demand for finer configuration of a semiconductor device.

Although the invention has been described with reference to specific embodiments, this description is not meant to be construed in a limiting sense. Various modification of the disclosed embodiments will become apparent to persons skilled in the art upon reference to the description of the invention. It is therefore contemplated that the appended claims will cover any modifications or embodiment as fall within the true scope of the invention.

What is claimed is:

1. A manufacturing method of a semiconductor device, comprising the steps of:

forming a silicon nitride film on a semiconductor substrate and forming a CVD silicon oxide-film on said silicon nitride film;

patterning said silicon nitride film and said CVD silicon oxide film with a resist mask;

forming a trench by etching said semiconductor substrate by using said patterned silicon nitride film and said patterned CVD silicon oxide film after releasing the resist mask; and embedding an insulating material into said trench and flattening said embedded insulating material using said silicon nitride film as a stopper, wherein the manufacturing method comprises a step of annealing treatment of said semiconductor substrate after the step of forming said CVD silicon oxide film and before the step of etching said semiconductor substrate.

2. The manufacturing method of a semiconductor device according to claim 1, wherein said annealing treatment is carried out in an oxidizing atmosphere before applying a resist.

3. The manufacturing method of a semiconductor device according to claim 1, wherein said annealing treatment is carried out in an inert gas atmosphere after patterning said silicon nitride film and said CVD silicon oxide film.

4. The manufacturing method of a semiconductor device according to claim 1, wherein said CVD silicon oxide film has thickness not smaller than 200 Å and smaller than 1000 Å.

5. The manufacturing method of a semiconductor device according to claim 1, wherein said annealing treatment is carried out at a temperature higher than a temperature at which said CVD silicon oxide film is formed.

6. The manufacturing method of a semiconductor device according to claim 5, wherein said annealing treatment is carried out within a temperature range from 700 to 1200° C.

7. The manufacturing method of a semiconductor device according to claim 1, wherein an SiON film is interposed between said silicon nitride film and said CVD silicon oxide film.

8. The manufacturing method of a semiconductor device according to claim 7, wherein said SiON film has thickness not exceeding 1300 Å.

* * * * *